(12) United States Patent
Kato et al.

(10) Patent No.: US 8,376,527 B2
(45) Date of Patent: Feb. 19, 2013

(54) LIQUID EJECTING HEAD AND LIQUID EJECTING APPARATUS

(75) Inventors: Jiro Kato, Suwa (JP); Toshiki Hara, Suwa (JP); Hiroaki Tamura, Shimosuwa-machi (JP); Satoshi Denda, Suwa (JP); Koichi Morozumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/983,459

(22) Filed: Jan. 3, 2011

(65) Prior Publication Data

US 2011/0169898 A1   Jul. 14, 2011

(30) Foreign Application Priority Data

Jan. 8, 2010   (JP) ................................ 2010-002663

(51) Int. Cl.
*B41J 2/045* (2006.01)
(52) U.S. Cl. ........................................... 347/68; 347/71
(58) Field of Classification Search .................. None
See application file for complete search history.

(56) References Cited

U.S. PATENT DOCUMENTS

| 7,812,425 | B2 * | 10/2010 | Yamakawa et al. | 257/534 |
|---|---|---|---|---|
| 2005/0052506 | A1 * | 3/2005 | Yagi et al. | 347/72 |
| 2008/0224571 | A1 | 9/2008 | Miyazawa et al. | |
| 2010/0007707 | A1 | 1/2010 | Morozumi et al. | |
| 2010/0085403 | A1 | 4/2010 | Miyazawa et al. | |
| 2010/0149285 | A1 | 6/2010 | Kato et al. | |
| 2011/0063376 | A1 | 3/2011 | Morozumi et al. | |
| 2011/0074889 | A1 | 3/2011 | Hara | |

FOREIGN PATENT DOCUMENTS

| JP | 2001-223404 | 8/2001 |
|---|---|---|
| JP | 2003-127366 | 5/2003 |
| JP | 2008-141107 | 6/2008 |
| JP | 2008-258575 | 10/2008 |
| JP | 2010-018011 | 1/2010 |
| JP | 2010-114417 | 5/2010 |
| JP | 2010-137444 | 6/2010 |

OTHER PUBLICATIONS

Wu Z et al, Defect structures and fatigue in forroelectric PZT thin films, Proceedings of the 1992 IEEE International Symposium on Applications of Ferroelectrics (ISAF 1992), Greenville, SC, USA.
Nishida T et al, Investigation of Crystal Defect in Lead Zirconate Titanate Films by Thermally Stimulated Current Measurement, Proceedings of the 2007 IEEE International Symposium on the Applications of Ferreoelectrics (ISAF 2007), Nara, JP, May 27, 2007, pp. 234-235.
Extended European Search Report dated May 2, 2011 issued in corresponding European Application No. 11150182.1.

* cited by examiner

*Primary Examiner* — Matthew Luu
*Assistant Examiner* — Erica Lin
(74) *Attorney, Agent, or Firm* — Workman Nydegger (57) ABSTRACT

A piezoelectric element comprising a first electrode, a piezoelectric layer which is composed of a metal oxide containing lead, zirconium and titanium and which formed above the first electrode, and a second electrode formed above the piezoelectric layer. The piezoelectric layer has negatively charged Pb—O complex defects and positively charged Pb—O complex defects, the concentration of the negatively charged Pb—O complex defects being higher than the concentration of the positively charged Pb—O complex defects.

6 Claims, 5 Drawing Sheets

LIQUID EJECTING HEAD AND LIQUID EJECTING APPARATUS

CROSS-REFERENCE TO RELATED APPLICATIONS

This application claims the benefit of priority to Japanese Patent Application No. 2010-002663 filed Jan. 8, 2010, the contents of which are hereby incorporated by reference in their entirety.

BACKGROUND

1. Technical Field

The present invention relates to a liquid ejecting head which ejects a liquid from nozzle openings, and a liquid ejecting apparatus.

2. Related Art

Piezoelectric elements used for liquid ejecting heads, for example, have a structure in which a piezoelectric layer composed of a piezoelectric material having an electromechanical conversion function, such as a crystallized dielectric material, is interposed between two electrodes. Such piezoelectric elements are mounted as actuator devices having a flexural vibration mode in liquid ejecting heads. A typical example of liquid ejecting heads is an ink jet recording head in which a part of a pressure-generating chamber is made of a vibration plate, the pressure-generating chamber communicating with a nozzle opening that ejects ink droplets, and by deforming the vibration plate by using a piezoelectric element, ink in the pressure-generating chamber is pressed so as to be ejected as ink droplets from the nozzle opening. Piezoelectric elements to be mounted in such an ink jet recording head are, for example, produced by forming a uniform piezoelectric material layer over the entire surface of a vibration plate using a film formation technique, and then forming the piezoelectric material layer into a shape which corresponds to pressure-generating chambers using a lithographic method such that the piezoelectric elements for the individual pressure-generating chambers are independent from each other.

As the piezoelectric material used for the piezoelectric elements, for example, a metal oxide having a perovskite structure, such as lead zirconate titanate (PZT), is used (refer to JP-A-2001-223404).

However, the piezoelectric elements, for example, composed of PZT thin films, have a problem of degradation due to operation, i.e., a problem in which device properties are degraded when applied with a voltage pulse over a long period of time. Such a problem occurs not only in ink jet recording heads but also in liquid ejecting heads that eject a liquid other than ink. Furthermore, the problem is not limited to piezoelectric elements used in liquid ejecting heads, but the problem also occurs in piezoelectric elements used in other devices.

SUMMARY

An advantage of some aspects of the invention is that the invention provides a liquid ejecting head and a liquid ejecting apparatus in which degradation due to operation of a piezoelectric layer is prevented and durability is improved.

According to a first aspect of the invention, a liquid ejecting head includes a pressure-generating chamber communicating with a nozzle opening, and a piezoelectric element which includes a first electrode, a piezoelectric layer disposed on the first electrode, and a second electrode disposed on the piezoelectric layer. The piezoelectric layer is composed of a metal oxide containing lead (Pb), zirconium (Zr), and titanium (Ti), and has negatively charged Pb—O complex defects and positively charged Pb—O complex defects, the concentration of the negatively charged Pb—O complex defects being higher than the concentration of the positively charged Pb—O complex defects. Since the negatively charged Pb—O complex defects are present in higher concentrations in the piezoelectric layer than the positively charged Pb—O complex defects, even if a voltage pulse is applied over a long period of time, degradation in device properties is small, and durability is improved.

It is preferable that the difference between the concentration of the negatively charged complex defects and the concentration of the positively charged complex defects is in a range of $0.2 \times 10^{18}/cm^3$ to $3.3 \times 10^{18}/cm^3$. In this case, the operational advantage due to the presence of the negatively charged Pb—O complex defects in higher concentrations in the piezoelectric layer than the positively charged Pb—O complex defects can be obtained more reliably, and durability is further improved.

Furthermore, it is preferable that the negatively charged complex defects and the positively charged complex defects are present in the interface with the first electrode which serves as a negative electrode. In this case, the operational advantage due to the presence of the negatively charged Pb—O complex defects in higher concentrations in the piezoelectric layer than the positively charged Pb—O complex defects can be obtained more reliably, and durability is further improved.

Furthermore, it is preferable that the piezoelectric layer is composed of lead zirconate titanate (PZT). In this case, the PZT piezoelectric layer which has a large piezoelectric displacement and which is stable can be obtained.

According to a second aspect of the invention, a liquid ejecting apparatus includes the liquid ejecting head according to the first aspect of the invention. In this case, the liquid ejecting apparatus includes the liquid ejecting head in which, since the negatively charged Pb—O complex defects are present in higher concentrations in the piezoelectric layer than the positively charged Pb—O complex defects, even if a voltage pulse is applied over a long period of time, degradation in device properties is decreased, and durability is improved. Therefore, it is possible to obtain the liquid ejecting apparatus having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
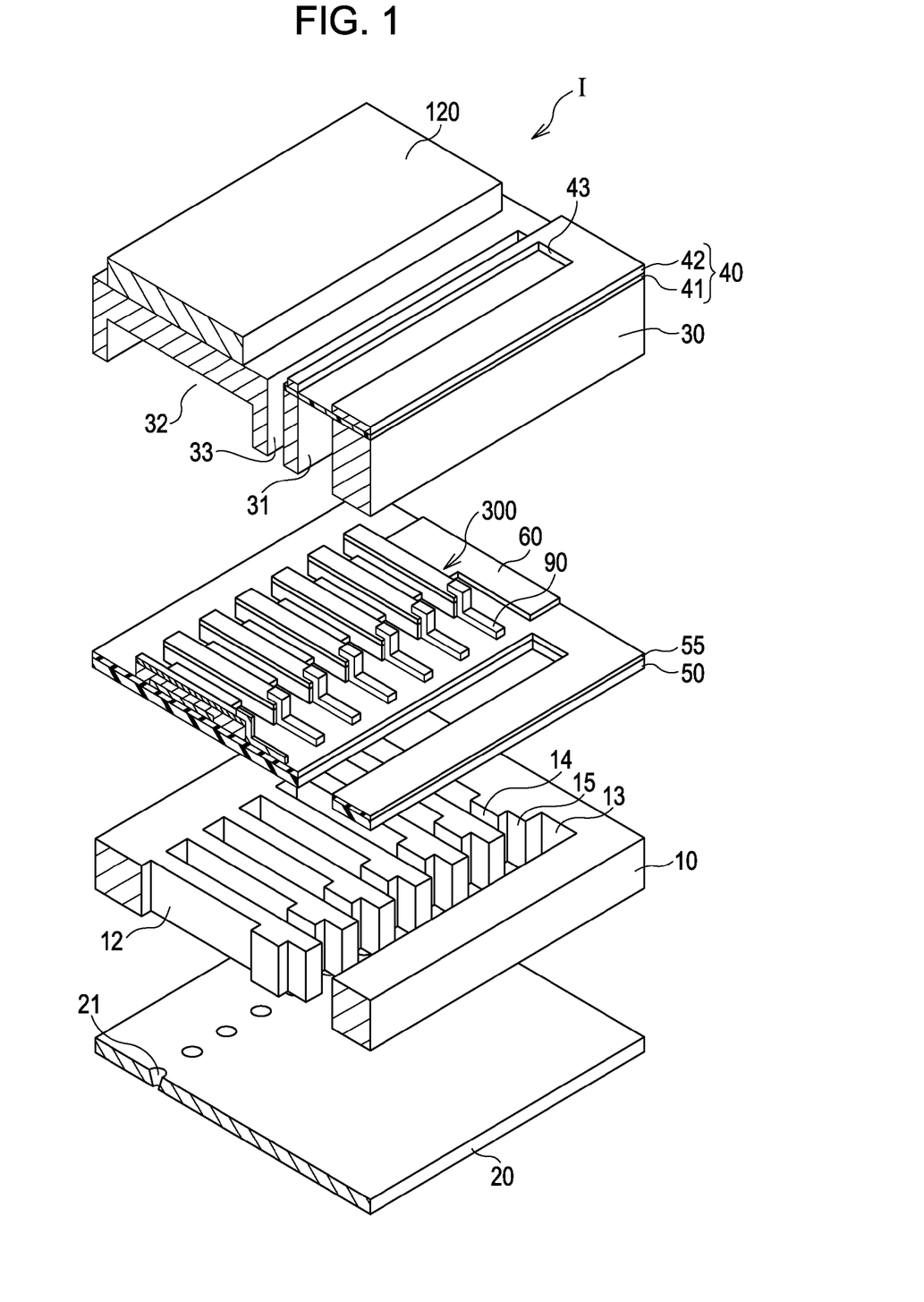
FIG. 1 is an exploded perspective view schematically showing a structure of a recording head according to a first embodiment.
Figure 2A:
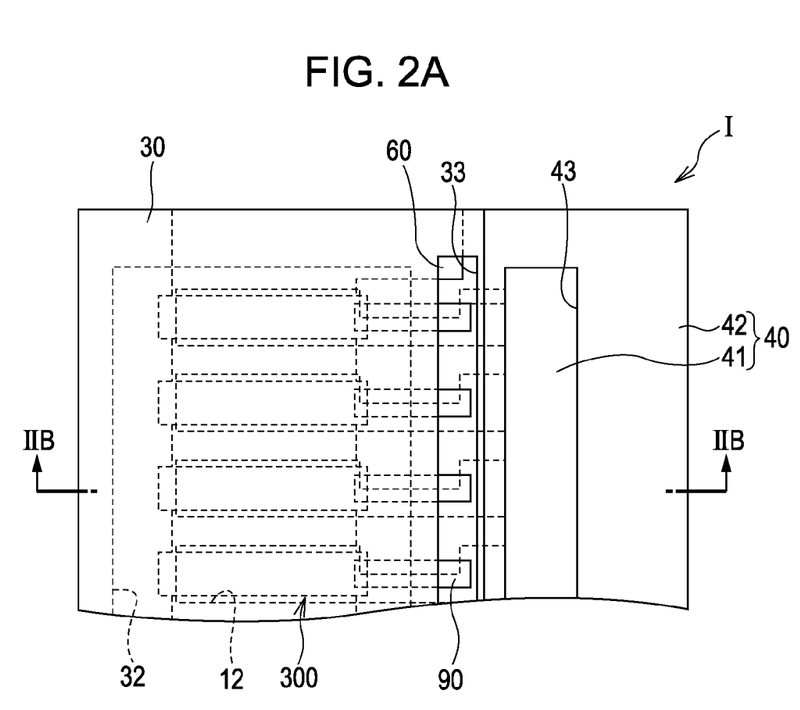
FIGS. 2A and 2B are a plan view and a cross-sectional view, respectively, of the recording head according to the first embodiment.
Figure 2B:
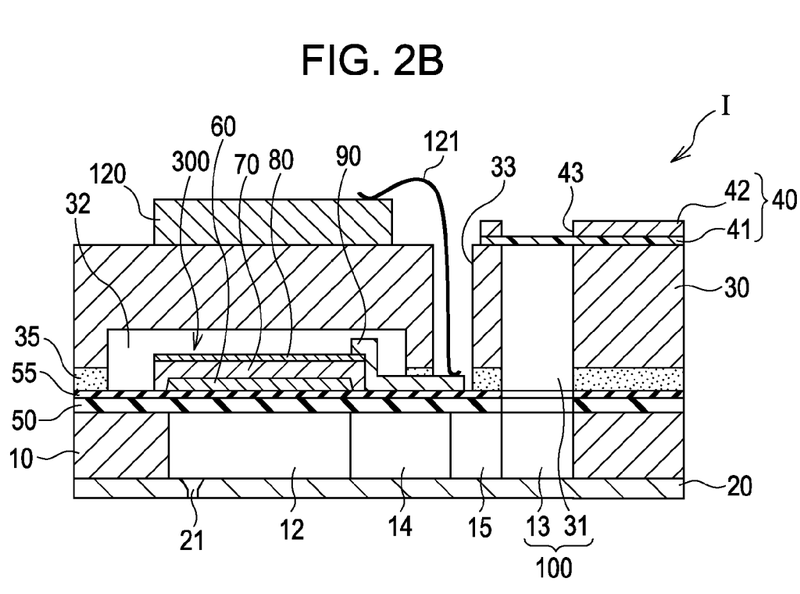

FIG. 1 is an exploded perspective view schematically showing a structure of an ink jet recording head, which is an example of a liquid ejecting head according to a first embodiment of the invention. FIGS. 2A and 2B are a plan view and a cross-sectional view taken along the line IIB-IIB in FIG. 2A, respectively, of the ink jet recording head shown in FIG. 1.

As shown in FIGS. 1, 2A, and 2B, a passage-forming substrate 10 according to this embodiment is made of a silicon single crystal substrate, and an elastic film 50 is disposed on one surface thereof.

A plurality of pressure-generating chambers 12 are placed in parallel in a width direction of the passage-forming substrate 10. A communicating portion 13 is provided in the passage-forming substrate 10 in a region located outside in the longitudinal direction of the pressure-generating chambers 12. The communicating portion 13 communicates with the pressure-generating chambers 12 through ink supply passages 14 and communicating passages 15 provided for the corresponding pressure-generating chambers 12. The communicating portion 13 communicates with a reservoir portion 31 of a protective substrate, which will be described below, to constitute a reservoir 100 that serves as a common ink chamber for the pressure-generating chambers 12. The ink supply passages 14 have a smaller width than that of the pressure-generating chambers 12 so that the flow passage resistance to ink flowing from the communicating portion 13 to the pressure-generating chambers 12 can be maintained constant. In this embodiment, the ink supply passages 14 are formed by shortening the width of flow passages from one side. However, the ink supply passages may be formed by shortening the width of flow passages from both sides. Furthermore, ink supply passages may be formed by shortening the thickness of the flow passages instead of shortening the width of the flow passages. In this embodiment, the passage-forming substrate 10 is provided with liquid flow passages constituted by the pressure-generating chambers 12, the communicating portion 13, the ink supply passages 14, and the communicating passages 15.

Furthermore, a nozzle plate 20 is fixed, by an adhesive, a thermally weldable film, or the like, to the opening surface side of the passage-forming substrate 10. The nozzle plate 20 has nozzle openings 21 formed by punching, each nozzle opening 21 communicating with the pressure-generating chamber 12 at a vicinity of an end opposite the corresponding ink supply passage 14. The nozzle plate 20 is composed of, for example, glass ceramic, a silicon single crystal substrate, or stainless steel.

Meanwhile, as described above, the elastic film 50 is disposed on a surface opposite the opening surface of the passage-forming substrate 10, and an insulating film 55 is disposed on the elastic film 50. A first electrode 60, a piezoelectric layer 70, for example, with a thickness of 10 µm or less, preferably 0.3 to 1.5 µm, and a second electrode 80 are stacked on the insulating film 55 to constitute a piezoelectric element 300. Here, the piezoelectric element 300 corresponds to a portion including the first electrode 60, the piezoelectric layer 70, and the second electrode 80. In general, one of the electrodes of the piezoelectric element 300 is formed as a common electrode, and the other electrode and the piezoelectric layer 70 are subjected to patterning for each pressure-generating chamber 12. In this embodiment, the first electrode 60 is a common electrode of the piezoelectric element 300 and the second electrode 80 is an individual electrode of the piezoelectric element 300. However, no problem occurs even if this is reversed because of the driving circuit or wiring. In this embodiment, the piezoelectric element 300 and the vibration plate in which displacement is caused by driving of the piezoelectric element 300 in combination are referred to as an actuator device. In the example described above, the elastic film 50, the insulating film 55, and the first electrode 60 function as a vibration plate. However, the invention is not limited thereto. For example, without providing the elastic film 50 and the insulating film 55, the first electrode 60 only may be configured to function as a vibration plate. Furthermore, the piezoelectric element 300 itself may be configured to also serve as a vibration plate.

The piezoelectric layer 70 disposed on the first electrode 60 is composed of a metal oxide which contains at least lead (Pb), zirconium (Zr), and titanium (Ti) and has a perovskite structure. In this embodiment, the piezoelectric layer 70 is composed of lead zirconate titanate (PZT). Furthermore, although detailed description will be made later, the piezoelectric layer 70 has negatively charged Pb—O complex defects and positively charged Pb—O complex defects, the concentration of the negatively charged Pb—O complex defects being higher than the concentration of the positively charged Pb—O complex defects.

The negatively charged Pb—O complex defects are defects caused by A-site Pb vacancies and are complex defects which are formed by involvement of oxygen (O) also detached from the A site and in which a plurality of Pb vacancies and O atoms gather together. The positively charged Pb—O complex defects are complex defects which are formed by Pb that cannot be present stably in the A site and is present as interstitial defects in the thin film together with oxygen (O) also detached from the A site and in which a plurality of Pb atoms and O atoms gather together. Most of the complex defects are present in the interface with the first electrode that is a lower electrode to which a negative voltage is applied.

These complex defects and the defect concentration can be measured by a thermally stimulated current (TSC) technique. The negatively charged Pb—O complex defects are detected at an energy level of 1.3 eV, and the positively charged Pb—O complex defects are detected at an energy level of 2.0 eV. The fact that the energy level of the crystal defects involving Pb is very high at 1.3 or 2.0 eV indicates that the crystal defects are not simple crystal defects, such as simple interstitial presence of single excess Pb or detachment of a single Pb atom from the A-site of PZT, but that complex defects in which a plurality of atoms are involved are formed, and proves that the crystal defects are Pb—O complex defects.

The method for forming the piezoelectric element 300 on the passage-forming substrate 10 is not particularly limited. For example, a method described below may be used. First, a silicon dioxide film composed of silicon dioxide ($SiO_2$) or the like constituting an elastic film 50 is formed on a surface of a wafer for passage-forming substrate, which is a silicon wafer. Next, an insulating film 55 composed of zirconium oxide or the like is formed on the elastic film 50 (silicon dioxide film).

Next, a first electrode 60 composed of platinum, iridium, or the like, is formed by sputtering or the like over the entire surface of the insulating film 55, and then patterning is performed.

Next, a piezoelectric layer 70 is stacked thereon. The method for producing the piezoelectric layer 70 is not particularly limited. For example, the piezoelectric layer 70 may be formed using a sol-gel method in which a sol obtained by dissolving/dispersing an organometallic compound in a solvent is applied and dried into a gel state, and the resulting gel is fired at a high temperature, thereby forming a piezoelectric layer 70 composed of a metal oxide. Note that the method for forming the piezoelectric layer 70 is not limited to the sol-gel method. For example, a metal-organic decomposition (MOD) method or a gas phase method, such as laser ablation or sputtering, may be used.

For example, first, a sol or MOD solution (precursor solution) containing organometallic compounds containing constituent metals of a piezoelectric material for forming a piezoelectric layer 70 is applied, by spin coating or the like, onto the first electrode 60, to form a piezoelectric precursor film (application step).

The precursor solution to be applied is obtained, for example, by mixing organometallic compounds containing constituent metals of the piezoelectric material for forming the piezoelectric layer 70 such that a desired molar ratio of the constituent metals is achieved, and dissolving or dispersing the resulting mixture using an organic solvent, such as alcohol. As the organometallic compounds containing constituent metals of the piezoelectric material, for example, metal alkoxides, organic acid salts, and β-diketone complexes can be used. Specifically, examples of lead (Pb)-containing organometallic compounds include lead acetate. Examples of zirconium (Zr)-containing organometallic compounds include zirconium acetylacetonato, zirconium tetraacetylacetonato, zirconium monoacetylacetonato, and zirconium bisacetylacetonato. Examples of titanium (Ti)-containing organometallic compounds include titanium alkoxide and titanium isopropoxide.

Furthermore, various additives, such as a stabilizing agent, may be added to the precursor solution as necessary. When the precursor solution is subjected to hydrolysis/polycondensation, an acid or a base, as a catalyst, may be added to the precursor solution together an appropriate amount of water. Examples of the additive to the precursor solution include diethanolamine and acetic acid. In addition, it is also possible to use various additives for improving properties of the piezoelectric layer 70. For example, in order to prevent occurrence of cracks, polyethylene glycol (PEG) or the like can be added to the precursor solution.

The number of spin rotations in spin coating can be set, for example, at about 500 rpm initially, and then the number of rotations can be increased to about 2,000 rpm so as to prevent uneven coating.

Next, the piezoelectric precursor film is dried by heating (drying step). For example, heat treatment is performed, using a hot plate or the like, in the air atmosphere at a temperature that is about 10° C. higher than the boiling point of the solvent used in the precursor solution.

Next, by heating the dried piezoelectric precursor film, organic components contained in the piezoelectric precursor film are eliminated as $NO_2$, $CO_2$, $H_2O$, or the like (degreasing step). For example, heat treatment is performed, using a hot plate, at about 300° C. to 400° C.

Next, by crystallizing the piezoelectric precursor film by heating (firing step), a piezoelectric layer 70 can be produced. For example, the crystallization can be performed by rapid thermal annealing (RTA) or the like, in an oxygen atmosphere at about 650° C. to 800° C.

Subsequently, preferably, annealing is performed in water vapor at about 300° C. for about one minute. By carrying out this step, the hydrogen concentration in the piezoelectric layer can be optimally controlled.

Furthermore, by repeating the application step, the drying step, and the degreasing step, or the application step, the drying step, the degreasing step, and the firing step a plurality of times according to the desired thickness or the like, a piezoelectric layer including a plurality of piezoelectric layers may be formed.

Subsequently, as necessary, post-annealing may be performed in a temperature range of 600° C. to 700° C. Thereby, it is possible to form a good interface between the piezoelectric layer 70 and the first electrode 60 or the second electrode 80, and crystallinity of the piezoelectric layer 70 can be improved.

After the piezoelectric layer 70 is formed, a second electrode 80, for example, composed of a metal, such as Pt, is deposited on the piezoelectric layer 70, and the piezoelectric layer 70 and the second electrode 80 are simultaneously subjected to patterning to form a piezoelectric element 300.

Note that the piezoelectric layer 70 in which the concentration of the negatively charged Pb—O complex defects is higher than the concentration of the positively charged Pb—O complex defects can be formed by comprehensively adjusting various control parameters, such as the concentration of Pb loaded in the precursor solution, the firing temperature of the piezoelectric precursor film, the firing time, the purity of raw materials used for the precursor solution, adjustment of impurity concentration, and optimization of the firing atmosphere for the piezoelectric precursor film.

In this embodiment, the amount of Pb loaded is set to be 1.18 times that in the case where the piezoelectric layer 70 is composed of lead zirconate titanate (PZT) having a perovskite structure represented by $Pb(Zr_{0.5}Ti_{0.5})O_3$. The defect concentrations of negatively charged complex defects detected at an energy level of 1.3 eV and positively charged Pb—O complex defects detected at an energy level of 2.0 eV were measured by the TSC technique. The measurement results were $2.7 \times 10^{18}$ $cm^{-3}$ for the negatively charged complex defects and $1.7 \times 10^{18}$ $cm^{-3}$ for the positively charged Pb—O complex defects.

Figure 3:
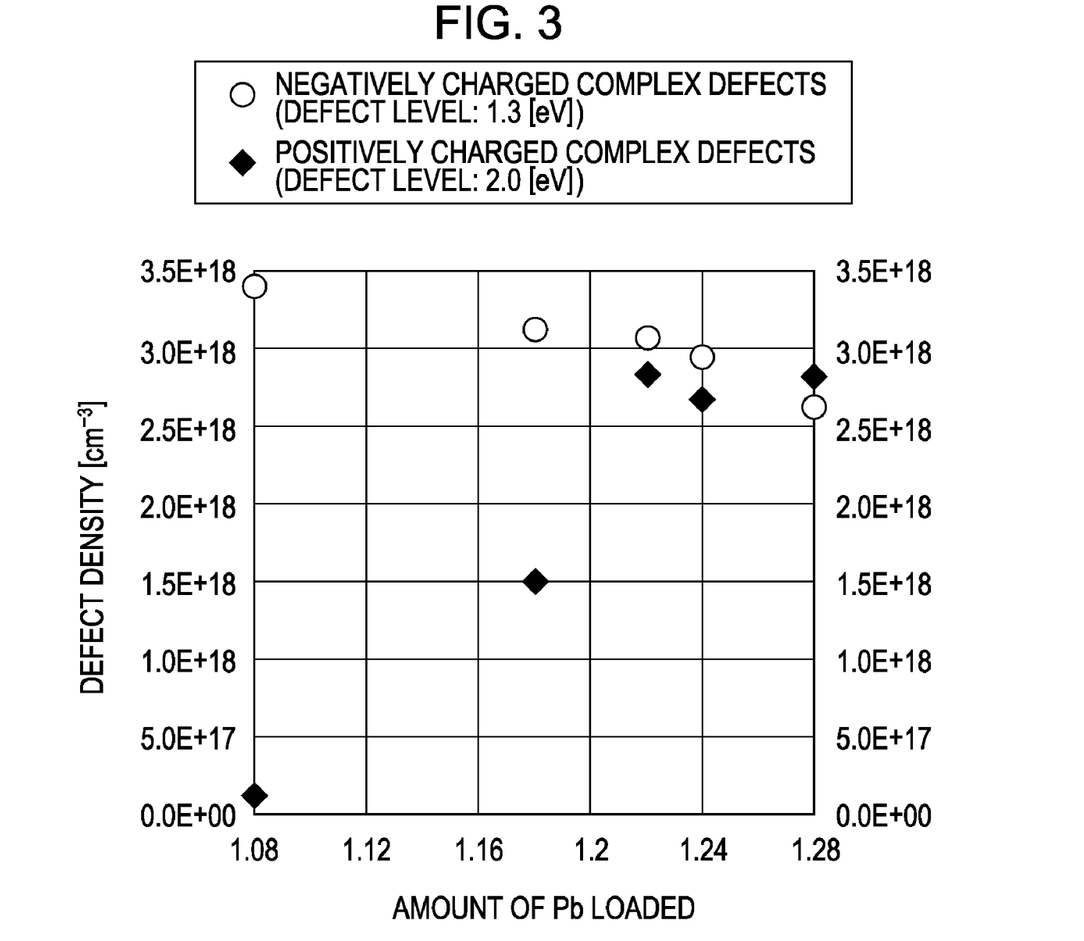
FIG. 3 is a graph showing the relationship between the amount of Pb loaded and the defect density measured by a TSC technique.

FIG. 3 shows the TSC measurement results together with the case where the amount of Pb loaded was changed in the range of 1.08 to 1.28 times. As shown in FIG. 3, when the defect concentrations of negatively charged complex defects and positively charged Pb—O complex defects detected at an energy level of 2.0 eV were measured, the concentration of negatively charged complex defects decreases as the amount of Pb loaded increases, and the concentration of positively charged Pb—O complex defects increases as the amount of Pb loaded increases. This proves indirectly that the negatively charged complex defects are complex defects caused by Pb vacancies, and the positively charged Pb—O complex defects are complex defects caused by excess Pb. Furthermore, the negatively charged complex defects which are defects in which Pb is not present in PZT tend to improve as the amount of Pb loaded increases, and in the positively charged Pb—O complex defects caused by excess Pb, the increasing tendency saturates when the amount of Pb loaded is 1.22 or more.

Note that the activation defect concentration (defect density) was determined from the formula:

$$N \times Exp\{-Ea/(k_B \times T)\}$$

where Ea is the energy level Ea, $k_B$ is the Boltzman constant, T is the absolute temperature, and N is the density of individual atoms.

The production of the piezoelectric element 300 according to this embodiment will now be described in more detail on the basis of specific examples.

(A) First, a SiO$_2$ layer was formed as an elastic film 50 by Si thermal oxidation on the surface of a passage-forming substrate 10 composed of a Si(110)-oriented substrate. The thickness was 1,000 nm.

(B) Next, an insulating film 55 was formed on the elastic film 50. The insulating film 55 was a ZrO$_2$ film with a thickness of 500 nm formed by thermal oxidation of a Zr film formed by sputtering.

(C) Next, a first electrode 60 was formed on the insulating film 55. The first electrode 60 was a film formed by sputtering Pt and Ir in that order with a thickness of 200 nm.

(D) Then, a piezoelectric layer 70 was formed on the first electrode 60. Specifically, a precursor solution prepared by dissolving and dispersing lead acetate, zirconium acetylacetonato, titanium isopropoxide, and PEG such that Pb:Zr:Ti=1.18:0.5:0.5 (molar ratio) in alcohol was applied by spin coating onto the first electrode 60 with a thickness of 200 nm (application step), followed by drying. Then, heat treatment was performed at 350° C. (degreasing step), heat treatment was performed by RTA in a 100% oxygen atmosphere at 780° C. for 15 seconds (firing step), and annealing was performed in water vapor at 300° C. for 45 seconds (water vapor annealing). The application step, the degreasing step, the firing step, and the water vapor annealing were repeated three times to obtain a piezoelectric layer 70 with a thickness of 600 nm.

(E) Next, a second electrode 80 composed of an Ir film with a thickness of 200 nm was formed by sputtering on the piezoelectric layer 70.

A lead electrode 90, for example, composed of gold (Au) or the like, is connected to the second electrode 80 which is an individual electrode of each piezoelectric element 300, the lead electrode 90 being led from the vicinity of an ink supply passage 14 side end of the second electrode 80 and extending onto the insulating film 55.

A protective substrate 30 having a reservoir portion 31 constituting at least a part of a reservoir 100 is bonded via an adhesive 35 onto the passage-forming substrate 10 provided with the piezoelectric element 300, i.e., onto the first electrode 60, the insulating film 55, and the lead electrode 90. In this embodiment, the reservoir portion 31 passes through the protective substrate 30 in the thickness direction and extends in the width direction of the pressure-generating chamber 12. As described above, the reservoir portion 31 communicates with a communicating portion 13 of the passage-forming substrate 10 to constitute a reservoir 100 that serves as a common ink chamber for the pressure-generating chambers 12. The communicating portion 13 of the passage-forming substrate 10 may be divided into portions corresponding to the respective pressure-generating chambers 12, and the reservoir portion 31 only may constitute the reservoir 100. Furthermore, for example, it may be possible to configure such that pressure-generating chambers 12 only are provided in the passage-forming substrate 10, and ink supply passages 14 that communicate between the reservoir 100 and the individual pressure-generating chambers 12 are provided in a member lying between the passage-forming substrate 10 and the protective substrate 30 (e.g., the elastic film 50, the insulating film 55, or the like).

Furthermore, a piezoelectric element holding portion 32 is provided in a region of the protective substrate 30 facing the piezoelectric element 300, the piezoelectric element holding portion 32 having a space that does not hinder the movement of the piezoelectric element 300. As long as the piezoelectric element holding portion 32 has a space that does not hinder the movement of the piezoelectric element 300, the space may be sealed or may not be sealed.

It is preferable that as the material for the protective substrate 30, a material having substantially the same coefficient of thermal expansion as that of the passage-forming substrate 10, such as glass or a ceramic material, is used. In this embodiment, the protective substrate 30 is formed using a silicon single crystal substrate, which is the same material as that for the passage-forming substrate 10.

Furthermore, a through-hole 33 that passes through the protective substrate 30 in the thickness direction is formed in the protective substrate 30. The end and its vicinity of the lead electrode 90 led from each piezoelectric element 300 is exposed to the inside of the through-hole 33.

Furthermore, a driving circuit 120 that is used for driving the piezoelectric elements 300 arranged in parallel to one another is fixed on the protective substrate 30. As the driving circuit 120, for example, a circuit board, a semiconductor integrated circuit (IC), or the like may be used. The driving circuit 120 and the lead electrode 90 are electrically connected to each other through a connection wiring 121 composed of a conductive wire, such as a bonding wire.

A compliance substrate 40 including a sealing film 41 and a fixing plate 42 is bonded onto the protective substrate 30. The sealing film 41 is composed of a flexible material that has low rigidity, and one side face of the reservoir portion 31 is sealed by the sealing film 41. The fixing plate 42 is composed of a relatively hard material. An area of the fixing plate 42 facing the reservoir 100 is an opening portion 43 that is completely removed in the thickness direction, and therefore, one side face of the reservoir 100 is sealed only by the flexible sealing film 41.

In the ink jet recording head according to this embodiment, the inside is filled with ink from the reservoir 100 up to the nozzle openings 21 by receiving ink from an ink inlet that is connected to external ink supplying means, not shown. Then, a voltage is applied between the first electrode 60 and the second electrode 80 corresponding to each pressure-generating chamber 12 in accordance with a recording signal from the driving circuit 120 so that the elastic film 50, the insulating film 55, the first electrode 60, and the piezoelectric layer 70 are subjected to deflection deformation. As a result, the pressure inside each pressure-generating chamber 12 is increased, and ink droplets are ejected from the nozzle opening 21.

EXAMPLES

Piezoelectric layers were formed, in which by changing the amount of Pb loaded, the precursor crystallization temperature, the crystallization conditions, and the like, the concentration of complex defects were changed. Thus, Examples 1 to 4 and Comparative Example were prepared. The embodiment described above was considered as Example 3.

Table 1 shows the defect concentration of negatively charged Pb—O complex defects (minus defect concentration) and the defect concentration of positively charged Pb—O complex defects (plus defect concentration). These were calculated using the TSC technique as described above. The difference between the minus defect concentration and the plus defect concentration is shown as the net defect concentration in Table 1. A positive net defect concentration indicates that the minus defect concentration is higher than the plus defect concentration. That is, in Examples 1 to 4, the concentration of the negatively charged Pb—O complex defects is higher than the concentration of the positively charged Pb—O complex defects, and the difference therebetween is in the range of $0.2 \times 10^{18}/cm^3$ to $3.3 \times 10^{18}/cm^3$. In Comparative Example, the concentration of the negatively charged Pb—O complex defects is lower than the concentration of the positively charged Pb—O complex defects, and the difference is negative.

In the case where a triangular wave with −2 to 30 V, 50 kHz, was applied, as a pulse for degradation, $1\times10^8$ times, to each of the piezoelectric elements in Examples 1 to 4 and Comparative Example, in which the first electrode was set to be negative and the second electrode was set to be positive, the rate of attenuation was determined from the amount of displacement in the initial stage and the amount of displacement after the application, which was considered as the degradation rate (%).

Figure 4:
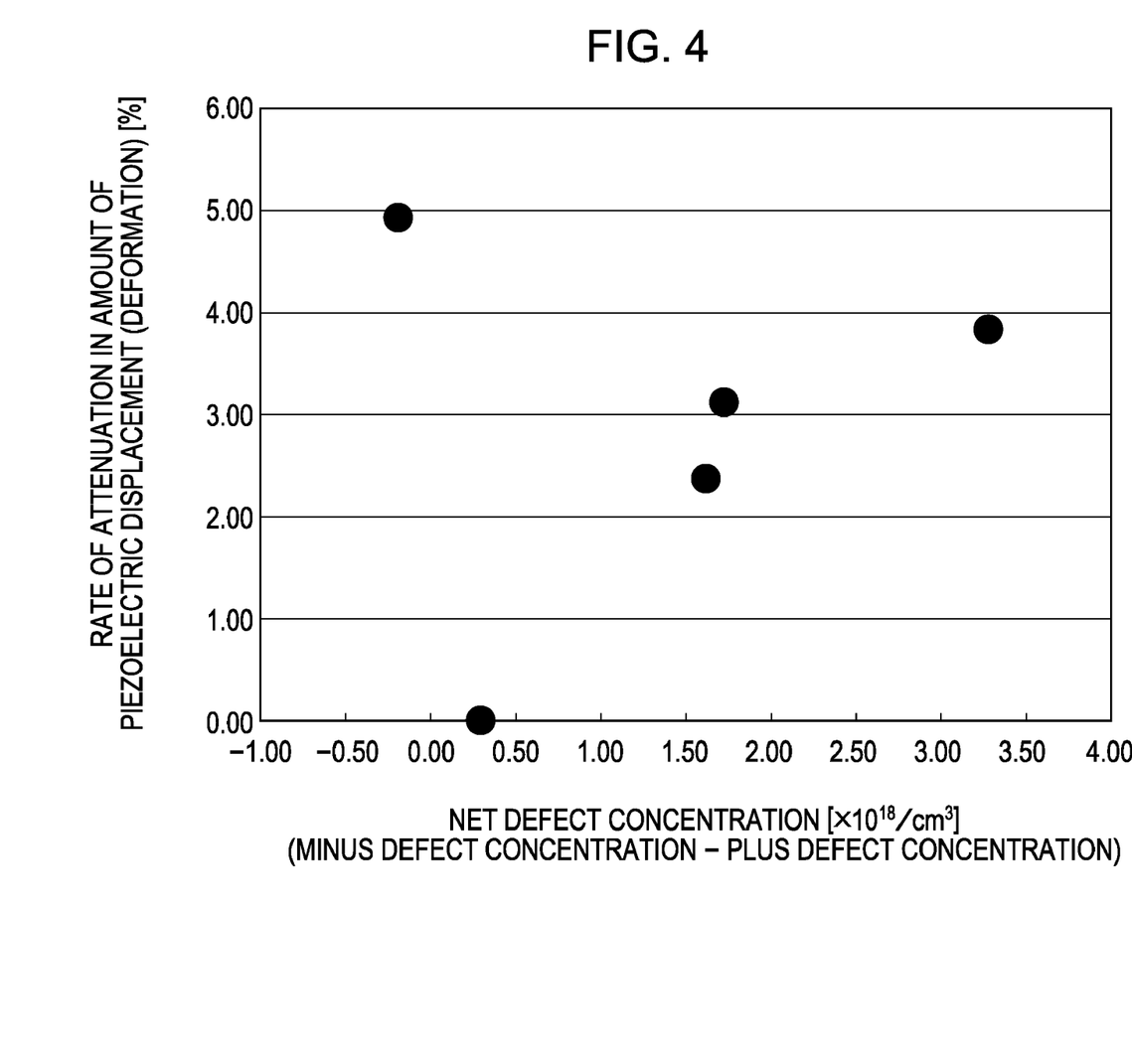
FIG. 4 is a graph showing the relationship between the rate of attenuation in the amount of piezoelectric displacement and the net defect concentration.

FIG. 4 shows the relationship between the rate of attenuation in the amount of piezoelectric displacement and the net defect concentration.

The results shows that, while the rate of attenuation (degradation rate) in the amount of piezoelectric displacement is 4.94% in Comparative Example, the rate of attenuation is 3.38% or less in Examples 1 to 4, indicating improvement in durability.

TABLE 1

| | Minus defect concentration $[10^{18} \text{ cm}^{-3}]$ | Plus defect concentration $[10^{18} \text{ cm}^{-3}]$ | Net defect concentration $[10^{18} \text{ cm}^{-3}]$ | Degradation rate [%] |
|---|---|---|---|---|
| Example 1 | 3.41 | 0.13 | 3.28 | 3.83 |
| Example 2 | 2.90 | 1.18 | 1.72 | 3.10 |
| Example 3 | 3.12 | 1.51 | 1.61 | 2.35 |
| Example 4 | 2.94 | 2.67 | 0.27 | 0.00 |
| Comparative Example | 2.61 | 2.80 | −0.19 | 4.94 |

Furthermore, regarding Comparative Example, in the environment where the temperature was gradually increased to 300° C., a durability acceleration test was carried out in which the pulse for degradation was applied $10^8$ times, and 2 Vc and Vc-Shift were measured at predetermined temperatures.

Here, 2 Vc is the width of the intercept at P=0 in the P-V hysteresis curve, and Vc-Shift is the average value of the intercept, i.e., the amount of shift in the hysteresis curve.

The results have confirmed that Vc-Shift decreases as the temperature increases, but shifts upward at about 150° C. and changes from negative to positive at about 200° C. This shows that degradation in the amount of piezoelectric displacement increases at an accelerated pace in this temperature region.

It has also been confirmed that the reversal of Vc-Shift occurring at about 150° C. is closely related to activation of positively charged Pb—O complex defects caused by excess Pb. As a result of separately conducted measurement of activation temperature of positively charged Pb—O complex defects, it has been confirmed that activation starts at about 150° C.

It has also been confirmed that the rapid decrease in Vc-Shift with the increase in temperature observed at about 40° C. tends to correspond to activation of negatively charged Pb—O complex defects caused by Pb vacancies.

From the above, it is expected that under the low temperature condition, negatively charged Pb—O complex defects are mainly present in PZT in the vicinity of the interface between the first electrode (lower electrode) and the PZT thin film; as the temperature increases, the percentage of positively charged Pb—O complex defects present increases; and at about 200° C., the percentage of positively charged Pb—O complex defects present gradually becomes larger than that of negatively charged Pb—O complex defects present, resulting in the state where charges completely opposite to those under the low temperature condition are bound in the interface between the first electrode (lower electrode) and the PZT thin film.

It has been confirmed from the analysis of Comparative Example described above that Pb—O complex defects containing Pb vacancies and Pb—O complex defects containing excess Pb are present in the PZT thin film in the vicinity of the interface between the first electrode (lower electrode) and the PZT thin film, and the degradation property of the device greatly varies depending on the percentage of these defects. Furthermore, it has been proved that, except in the case where the occurrence of excessive Pb defects in the PZT thin film itself causes a marked decrease in the leak property or the like, resulting in device failure, it is preferable to form a PZT thin film such that the concentration of negatively charged Pb—O complex defects containing Pb vacancies is higher than the concentration of positively charged Pb—O complex defects containing excess Pb in order to improve durability.

Other Embodiments

An embodiment of the invention has been described above. However, the basic configuration according to the invention is not limited thereto. For example, in the embodiment described above, an example in which the crystals of the piezoelectric layer 70 are preferentially oriented along the (100) plane has been described. However, the crystals of the piezoelectric layer 70 may be preferentially oriented in any direction.

Furthermore, in the embodiment described above, a silicon single crystal substrate, the crystal plane orientation of which is the (110) plane, is exemplified as the passage-forming substrate 10. However, the invention is not limited thereto. For example, a silicon single crystal substrate, the crystal plane orientation of which is the (100) plane, may be used. Alternatively, a material, such as a SOI substrate or glass, may be used.

In addition, in the embodiment described above, a piezoelectric element 300 in which a first electrode 60, a piezoelectric layer 70, and a second electrode 80 are stacked in that order on the substrate (passage-forming substrate 10) has been exemplified. However, the invention is not limited thereto. For example, the invention may be applied to a piezoelectric element of a vertically vibrating type in which a piezoelectric material and an electrode-forming material are alternately stacked so as to expand or contract in the axis direction.

Figure 5:
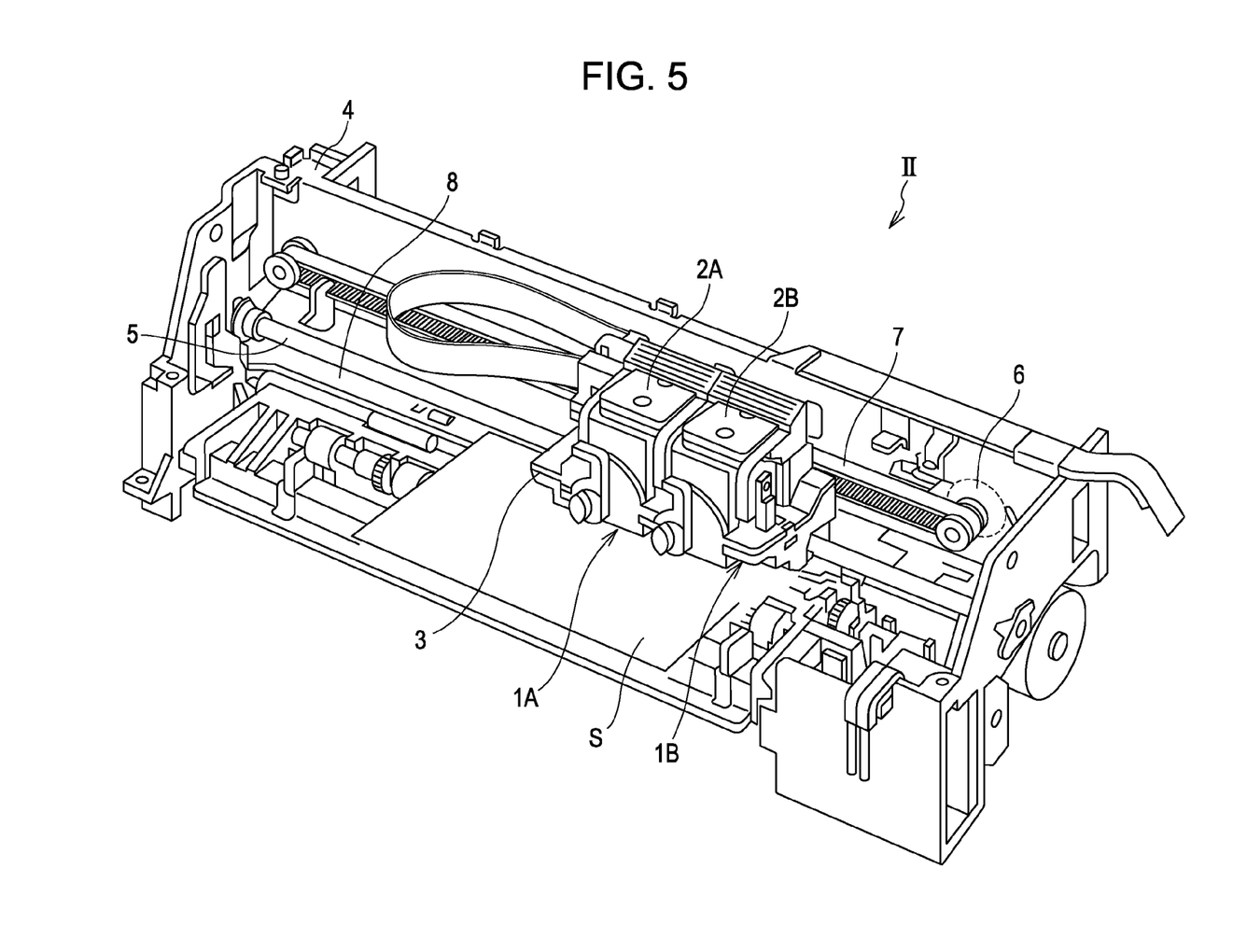
FIG. 5 is a perspective view schematically showing a structure of a recording apparatus according to an embodiment of the invention.

Furthermore, the ink jet recording head according to any of the embodiments described above constitutes a part of a recording head unit that includes an ink flow passage communicating with an ink cartridge or the like and is mounted in an ink jet recording apparatus. FIG. 5 is a perspective view schematically showing an example of the ink jet recording apparatus.

In an ink jet recording apparatus II shown in FIG. 5, cartridges 2A and 2B constituting ink supplying means are detachably mounted in recording head units 1A and 1B having ink jet recording heads I. A carriage 3 in which the recording head units 1A and 1B are mounted is provided on a carriage shaft 5, which is fixed to an apparatus main body 4, so as to be freely movable along the shaft direction. The recording head units 1A and 1B are, for example, configured to eject a black ink composition and a color ink composition, respectively.

When the driving force of a driving motor 6 is conveyed to the carriage 3 through a plurality of gears, not shown, and a timing belt 7, the carriage 3 in which the recording head units 1A and 1B are mounted is moved along the carriage shaft 5. Meanwhile, a platen 8 is provided in the apparatus main body 4 so as to extend along the carriage shaft 5. A recording sheet S which is a recording medium, such as paper, is fed by a paper feed roller or the like, not shown, and is transported while being wound around the platen 8.

In the first embodiment described above, the ink jet recording head has been described as an example of a liquid ejecting head. The invention is directed broadly to liquid ejecting heads in general, and can also be applied to liquid ejecting heads that eject a liquid other than ink. Examples of other liquid ejecting heads include various recording heads used for image recording apparatuses, such as printers; coloring material ejecting heads used for manufacturing color filters for liquid crystal displays or the like; organic EL displays; electrode material ejecting heads used for forming electrodes for field emission displays (FEDs) or the like; and bio-organic substance ejecting heads for manufacturing biochips.

Furthermore, the invention is not limited to piezoelectric element to be mounted in liquid ejecting heads, such as ink jet recording heads, but can also be applied to piezoelectric elements to be mounted in other apparatuses, such as thin-film capacitors.

What is claimed is:

1. A piezoelectric element comprising:
   a first electrode,
   a piezoelectric layer which is composed of a metal oxide containing lead, zirconium and titanium and which formed above the first electrode, and
   a second electrode formed above the piezoelectric layer,
   wherein the piezoelectric layer has negatively charged Pb—O complex defects and positively charged Pb—O complex defects, the concentration of the negatively charged Pb—O complex defects being higher than the concentration of the positively charged Pb—O complex defects, and
   wherein the negatively charged Pb—O complex defects and the positively charged Pb—O complex defects are formed by an increased lead concentration in the piezoelectric layer.

2. The piezoelectric element according to claim 1, wherein the difference between the concentration of the negatively charged complex defects and the concentration of the positively charged complex defects is in a range of $0.2\times10^{18}/cm^3$ to $3.3\times10^{18}/cm^3$.

3. The piezoelectric element according to claim 1, wherein the negatively charged complex defects and the positively charged complex defects are present in an interface with the first electrode which serves as a negative electrode.

4. The piezoelectric element according to claim 1, wherein the piezoelectric layer is composed of lead zirconate titanate (PZT).

5. A liquid ejecting head comprising the piezoelectric element according to claim 1.

6. A liquid ejecting apparatus comprising the liquid ejecting head according to claim 5.

* * * * *